(12) United States Patent
Maruyama

(10) Patent No.: US 11,876,500 B2
(45) Date of Patent: Jan. 16, 2024

(54) RECEIVER, SYSTEM, AND OPERATION METHOD OF RECEIVER

(71) Applicant: FUJITSU SEMICONDUCTOR MEMORY SOLUTION LIMITED, Yokohama (JP)

(72) Inventor: Tetsuya Maruyama, Yokohama (JP)

(73) Assignee: FUJITSU SEMICONDUCTOR MEMORY SOLUTION LIMITED, Yokohama (JP)

( * ) Notice: Subject to any disclaimer, the term of this patent is extended or adjusted under 35 U.S.C. 154(b) by 57 days.

(21) Appl. No.: 17/543,959

(22) Filed: Dec. 7, 2021

(65) Prior Publication Data
US 2022/0239272 A1   Jul. 28, 2022

(30) Foreign Application Priority Data
Jan. 26, 2021   (JP) .................................. 2021-010098

(51) Int. Cl.
| H03H 7/38 | (2006.01) |
|---|---|
| H04B 1/16 | (2006.01) |
| H03K 5/01 | (2006.01) |
| H03K 5/00 | (2006.01) |

(52) U.S. Cl.
CPC ................ *H03H 7/38* (2013.01); *H03K 5/01* (2013.01); *H04B 1/16* (2013.01); *H03K 2005/00013* (2013.01)

(58) Field of Classification Search
CPC . H03H 7/48; H03H 11/28; H03H 7/38; H03F 2200/451; H03F 3/245; H03F 2200/387; H03F 3/195; H03F 1/0277; H03F 2200/318
See application file for complete search history.

(56) References Cited

U.S. PATENT DOCUMENTS

| 8,390,456 B2 * | 3/2013 | Puleston | ................. H04L 67/04 340/572.1 |
|---|---|---|---|
| 10,868,500 B1 * | 12/2020 | Srinidhi Embar | .... H03F 1/0288 |
| 11,152,893 B2 * | 10/2021 | Yamada | ................ H03F 1/0205 |
| 11,329,374 B2 * | 5/2022 | Li | ............................ H01Q 1/48 |
| 2014/0300453 A1 | 10/2014 | Takeoka et al. | |

FOREIGN PATENT DOCUMENTS

| JP | 2015-39235 A | 2/2015 |
|---|---|---|
| JP | 2019-47205 A | 3/2019 |
| JP | 2019-530395 A | 10/2019 |
| WO | 2018/039486 A1 | 3/2018 |

* cited by examiner

*Primary Examiner* — Diana J. Cheng
(74) *Attorney, Agent, or Firm* — WHDA, LLP

(57) ABSTRACT

A receiver includes a first matching circuit configured to receive antenna input power through a branch point in accordance with a radio signal received by an antenna and input a portion of the received antenna input power to a first circuit as first input power, the antenna input power being input from the antenna, and an impedance of the first matching circuit decreasing as the antenna input power increases, and a second matching circuit configured to receive the antenna input power through the branch point and input another portion of the received antenna input power to a second circuit as second input power, an impedance of the second matching circuit increasing as the antenna input power increases.

14 Claims, 13 Drawing Sheets

RECEIVER, SYSTEM, AND OPERATION METHOD OF RECEIVER

CROSS-REFERENCE TO RELATED APPLICATIONS

The present application is based upon and claims the benefit of priority of the prior Japanese Patent Application No. 2021-010098 filed on Jan. 26, 2021, with the Japanese Patent Office, the entire contents of which are incorporated herein by reference.

FIELD

The present invention relates to a receiver, a system, and an operation method of the receiver.

BACKGROUND

A radio communication device including a radio frequency identification (RFID) system and a cellular system with high transmission power is known. It the frequency bands of the RFID system and the cellular system are identical, a radio section of the RFID system that receives a transmission signal from the cellular system is driven by the transmission signal, so that spurious emissions increase. Thus, a resonant circuit that changes the resonant frequency to be out of the frequency band when receiving the transmission signal of the cellular system is provided in a power supply circuit of the radio section (see, for example, Patent Document 1). Additionally, a radio power receiver having interleaved rectifiers or a matching device is known (see, for example, Patent Documents 2 and 3).

RELATED-ART DOCUMENTS

Patent Document

[Patent Document 1] Japanese Laid-Open Patent Publication No. 2015-39235
[Patent Document 2] Japanese National Publication of International Patent Application No. 2019-530395
[Patent Document 3] Japanese Laid-Open Patent Publication No. 2019-47205

SUMMARY

According to an aspect of the embodiment, a receiver includes a first matching circuit configured to receive antenna input power through a branch point in accordance with a radio signal received by an antenna and input a portion of the received antenna input power to a first circuit as first input power, the antenna input power being input from the antenna, and impedance of the first matching circuit decreasing as the antenna input power increases, and a second matching circuit configured to receive the antenna input power through the branch point and input another portion of the received antenna input power to a second circuit as second input power, impedance of the second matching circuit increasing as the antenna input power increases.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In RFID tags and the like, there is a case in which a radio signal received through an antenna is converted to multiple types of power to operate multiple types of internal circuits. However, no method has been proposed to optimise the power efficiency of each of the multiple types of power with respect to the antenna input power. For example, if there is a difference in the power efficiency of the multiple types of power, a communication distance that can receive power to operate a corresponding internal circuit is shortened on the side where the power efficiency is low.

In one aspect, according to the present disclosure, the power efficiency of each of multiple types of power in a receiver that converts a radio signal received through an antenna to the multiple types of power can be optimized.

Embodiments will be described below with reference to the drawings.

Figure 1:
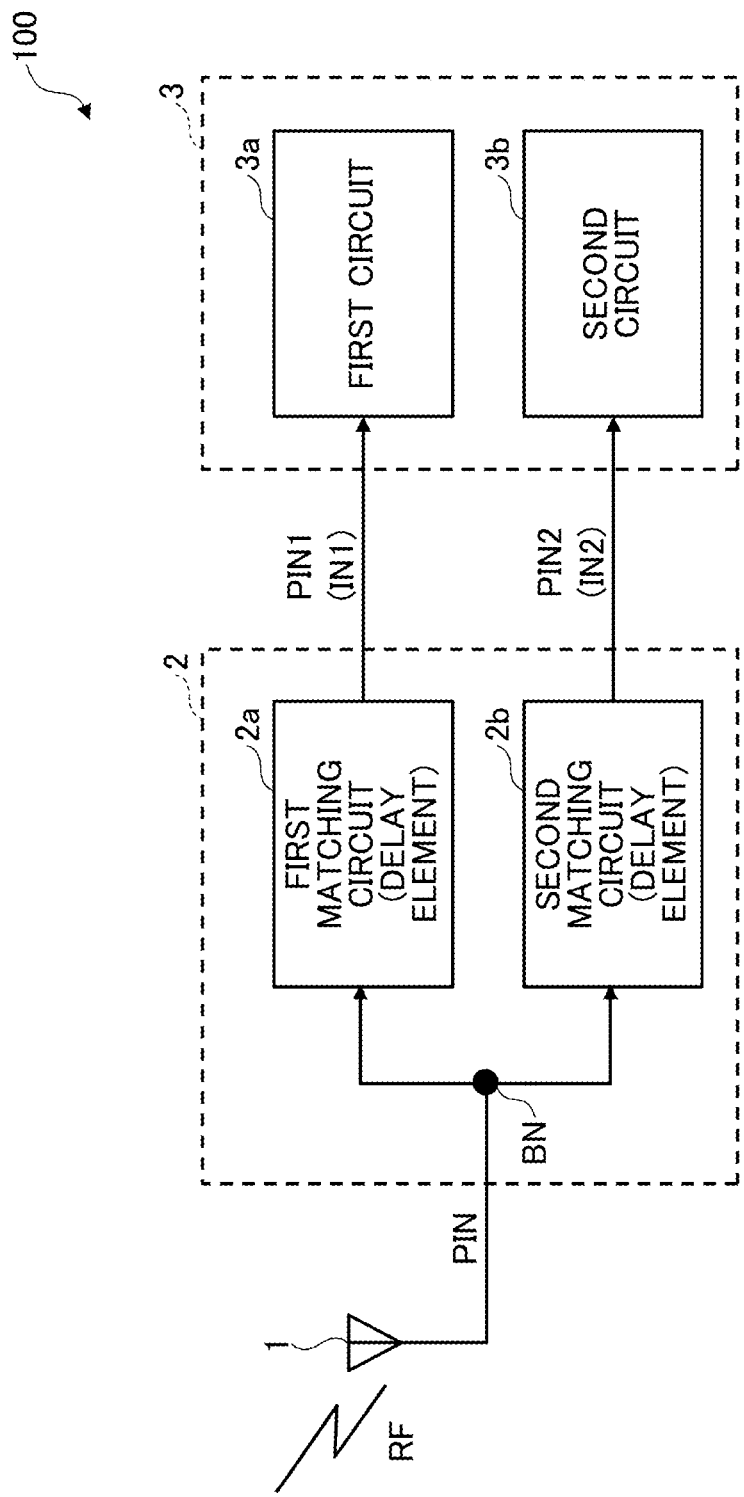
FIG. 1 is a block diagram illustrating an example of a system including a receiver according to an embodiment.

FIG. 1 illustrates an example of a system including a receiver according to an embodiment. A system 100 illustrated in FIG. 1 includes an antenna 1, a receiver 2, and a circuit section 3. The circuit section 3 includes a first circuit 3a and a second circuit 3b and is mounted on large-scale integration (LSI), for example. The antenna 1 and the receiver 2 are connected through a lead, and the receiver 2 is connected to each of the first circuit 3a and the second circuit 3b through a lead. For example, the receiver 2 and the circuit section 3 are mounted to a wiring board accommodated in a housing of the system 100. The antenna 1 may be incorporated in the wiring board or mounted on the wiring board. By incorporating the antenna 1 into the wiring board, the size of the system 100 can be reduced.

For example, the system 100 is a radio frequency identification (RFID) tag, but the system 100 is not limited thereto. The circuit section 3 including the first circuit 3a and the second circuit 3b is mounted on an LSI chip for RFID.

The antenna 1 receives a high frequency radio signal RF transmitted from a reader/writer for the RFID tag and outputs antenna input power PIN in accordance with the received radio signal RF to the receiver 2. The receiver 2 includes a first matching circuit 2a and a second matching circuit 2b connected in parallel to the antenna 1 through a branch point BN.

The first matching circuit 2a includes a delay element and has a function to perform impedance matching. The first matching circuit 2a inputs a portion of the antenna input power PIN input through the branch point BN as first input power PIN1 (a first high frequency input signal IN1) to the first circuit 3a. The first circuit 3a operates in response to receiving the first input power PIN1. The first matching circuit 2a includes a π-type circuit, a T-type circuit, or a distributed element circuit and is designed to reduce the impedance as the antenna input power PIN increases.

The second matching circuit 2b includes a delay element and has a function to perform impedance matching. The second matching circuit 2b inputs another portion of the antenna input power PIN input through the branch point BN to the second circuit 3b as second input power PIN2 (a second high frequency input signal IN2). The second circuit 3b operates in response to receiving the second input power PIN2. The second matching circuit 2b includes a π-type circuit, a T-type circuit, or a distributed element circuit and is designed to increase the impedance as the antenna input power PIN increases.

A delay amount of the delay element of the first matching circuit 2a and a delay amount of the delay element of the second matching circuit 2b are different from each other. This allows phases of the first input signal IN1 and the second input signal IN2 to shift from each other. For example, the delay amount of the delay element of the first matching circuit 2a is set to 0°, and the delay amount of the delay element of the second matching circuit 2b is set to +90° or +45°. That is, the phase of the second input signal IN2 is delayed by, for example, 90° or 45° relative to the phase of the first input signal IN1. Here, the delay amount is indicated by a phase of the radio signal RF received by the antenna 1. For example, the delay amounts of the delay elements of the first matching circuit 2a and the second matching circuit 2b are less than one period of the radio signal RF.

The delay amount of the delay element of the first matching circuit 2a may be set to be 0°, and the delay amount of the delay element of the second matching circuit 2b may be set to be −90° or −45°. Additionally, the delay amount of the delay element of the first matching circuit 2a may be set to be −45°, and the delay amount of the delay element of the second matching circuit 2b may be set to be +45°. Further, the delay amount of the delay element of the first matching circuit 2a may be set to +45°, and the delay amount of the delay element of the second matching circuit 2b may be set to −45°.

The delay amounts of the delay elements of the first matching circuit 2a and the second matching circuit 2b are set to values in which a predetermined communication characteristic is obtained in consideration of the frequency characteristics of the impedance of the antenna 1 and the impedance on the first circuit 3a side and on the second circuit 3b side. In this case, the delay amounts of the delay elements of the first matching circuit 2a and the second matching circuit 2b may be set in consideration of simplification of the first matching circuit 2a and the second matching circuit 2b.

Figure 2:
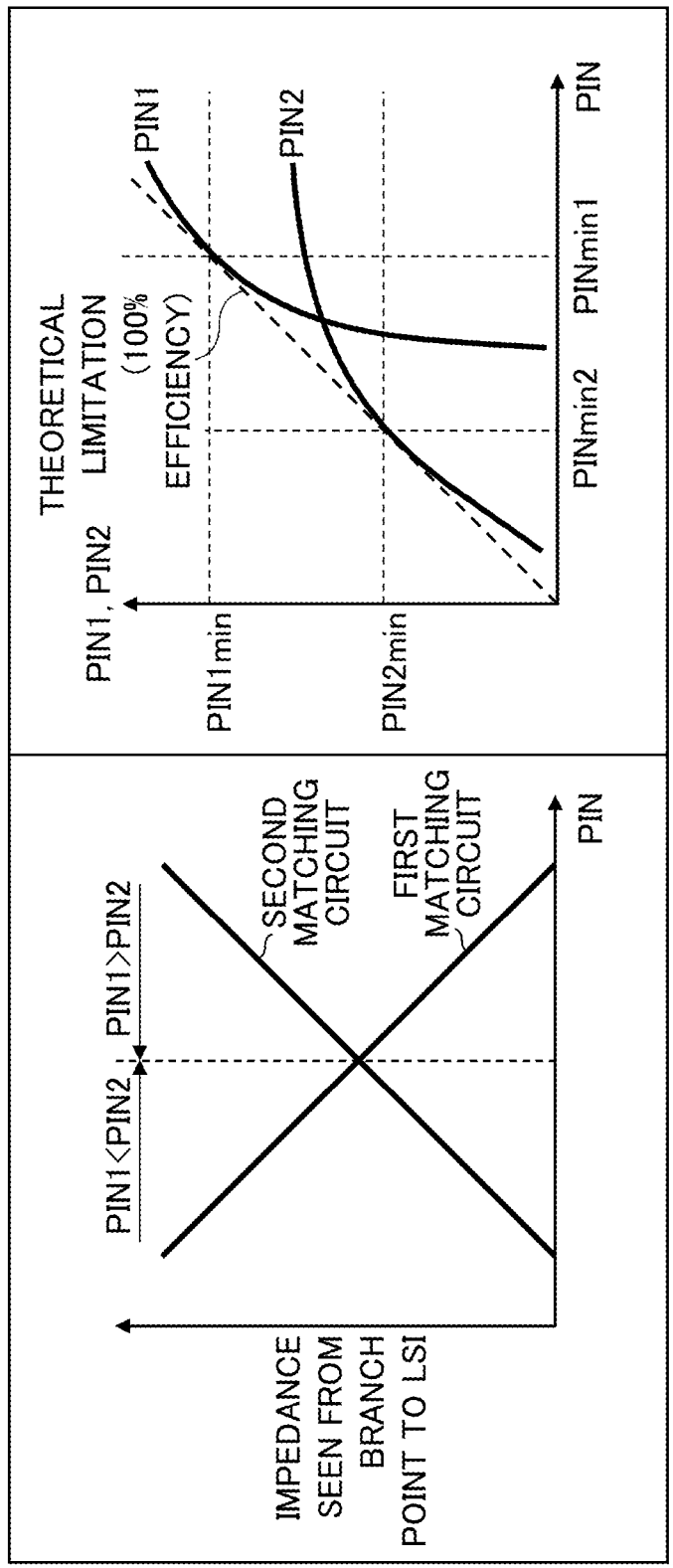
FIG. 2 is of graphs illustrating an example of the impedance characteristic and the power characteristic of the receiver in FIG. 1.

FIG. 2 illustrates an example of the impedance and the power characteristic of the receiver 2 of FIG. 1. That is, FIG. 2 illustrates an example of an operation method of the receiver 2. As illustrated in the impedance characteristic of FIG. 2 on the left side, the impedance of the first matching circuit 2a seen from the branch point BN to the LSI is approximately inversely proportional to the antenna input power PIN. The impedance of the second matching circuit 2b seen from the branch point BN to the LSI is approximately proportional to the antenna input power PIN. That is, the impedance of the first matching circuit 2a decreases as the antenna input power PIN increases, and the impedance of the second matching circuit 2b increases as the antenna input power PIN increases.

When the antenna input power PIN is small, the impedance of the first matching circuit 2a is high, and the impedance of the second matching circuit 2b is low, so that most of the antenna input power PIN is supplied to the second circuit 3b as the second input power PIN2 (PIN1<PIN2). When the antenna input power PIN is large, the impedance of the first matching circuit 2a is low, and the impedance of the second matching circuit 2b is high, so that most of the antenna input power PIN is supplied to the first circuit 3a as the first input power PIN1 (PIN1>PIN2). Thus, as illustrated in FIG. 2 on the right side, when the antenna input power PIN exceeds a power value PINmin2, the second input power PIN2 exceeds minimum power PIN2min at which the second circuit 3b can operate, and the second circuit 3b can start operation. At this time, because the impedance of the first matching circuit 2a is high and the first input power PIN1 is lower than the second input power PIN2, the first input power PIN1 does not reach minimum power PIN1min at which the first circuit 3a can operate. Thus, the first circuit 3a does not operate. Therefore, most of the antenna input power PIN can be used for operation of the second circuit 3b to improve the power efficiency.

When the antenna input power PIN exceeds the power value PINmin1, the first input power PIN1 exceeds the minimum power PIN1min at which the first circuit 3a can operate, and the first circuit 3a can start operation. At this time, the impedance of the second matching circuit 2b is high, and the increase of the second input power PIN2 has peaked. Thus, the extra second input power PIN2 can be prevented from being supplied to the second circuit 3b. Therefore, the required minimum second input power PIN2 can be supplied to the second circuit 3b and the remaining power can be used for the operation of the first circuit 3a to improve the power efficiency.

As described above, in the present embodiment, the first input power PIN1 and the second input power PIN2 input in accordance with the antenna input power PIN can be close to an ideal power distribution characteristic. The delay amounts (the phases) of the delay elements of the first matching circuit 2a and the second matching circuit 2b are caused to be different from each other, so that the change characteristics of the impedance of the first matching circuit 2a and the impedance of the second matching circuit 2b with respect to the antenna input power PIN can be reversed from each other.

That is, the impedance of the first matching circuit 2a can be reduced as the antenna input power PIN increases, and the impedance of the second matching circuit 2b can increase as the antenna input power PIN increases. Therefore, as described in FIG. 2, the first input power PIN1 supplied to the first circuit 3a and the second input power PIN2 supplied to the second circuit 3b can be appropriately set in accordance with the antenna input power PIN. As a result, the first input power PIN1 and the second input power PIN2 can be appropriately distributed according to the size of the antenna input power PIN in the receiver 2 that converts the radio signal RF received through the antenna 1 into multiple types of power, thereby optimizing the power efficiency tor each of the multiple types of power.

Figure 3:
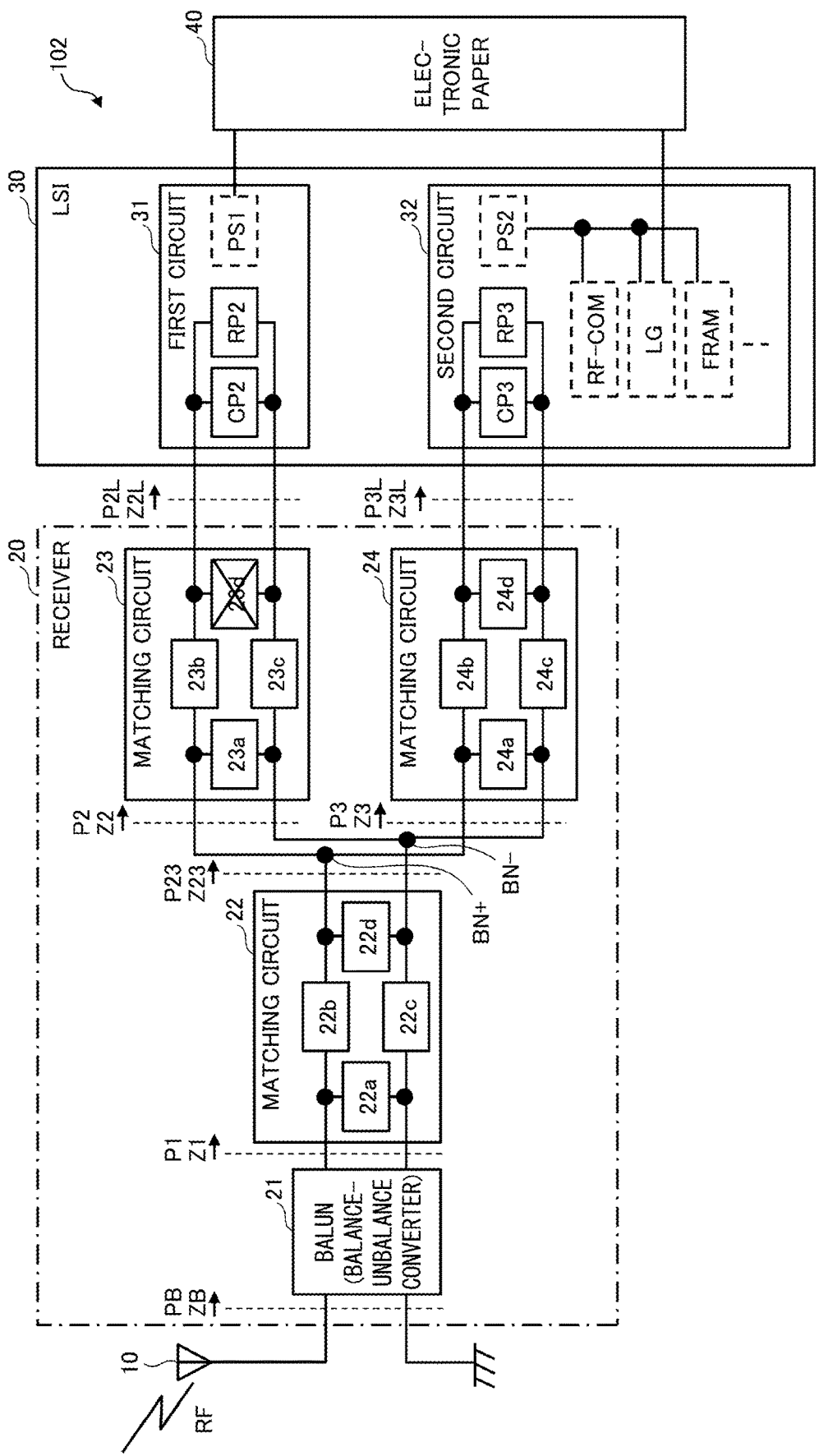
FIG. 3 is a block diagram illustrating an example of a system including a receiver according to another embodiment.

FIG. 3 illustrates an example of a system including a receiver in another embodiment. For elements substantially the same as the elements in FIG. 1, the detailed description will be omitted. A system 102 illustrated in FIG. 3 includes an antenna 10, a receiver 20, an LSI 30, and an electronic paper 40. The electronic paper 40 is an example of an electronic device.

The receiver 20 includes a balun (a balance-unbalance converter) 21 and matching circuits 22, 23, and 24. An LSI 30 includes a first circuit 31 and a second circuit 32. The system 102 is an RFID battery-less electronic paper tag, for example, but is not limited thereto. The LSI 30 is an LSI chip for the RFID.

The receiver 20 receives the radio signal RF from the antenna 10 as an unbalanced signal. The balun 21 is disposed between the antenna 10 and the matching circuit 22 and converts the unbalanced signal received from the antenna 10 into a balanced signal and outputs the balanced signal to the matching circuit 22.

The matching circuit 22 is disposed between the balun 21 and branch points BN+ and BN− to perform impedance matching between the balun 21 and the branch points BN+ and BN−. For example, the matching circuit 22 includes elements 22a, 22b, 22c, and 22d as π-type circuits. At least one of the elements 22a, 22b, 22c, and 22d includes a delay element.

Figure 7:
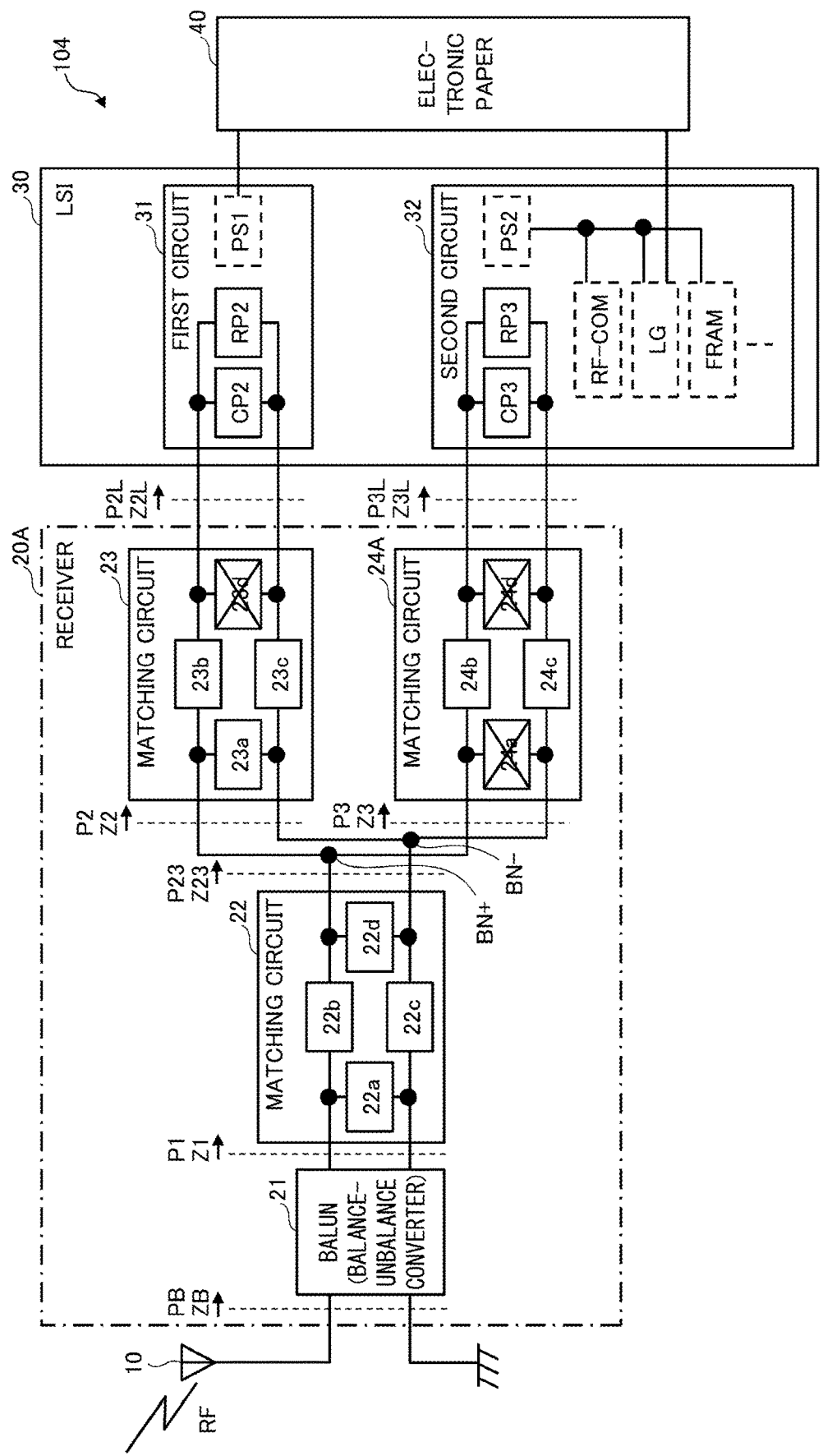
FIG. 7 is a block diagram illustrating an example of a system including another receiver.
Figure 10:
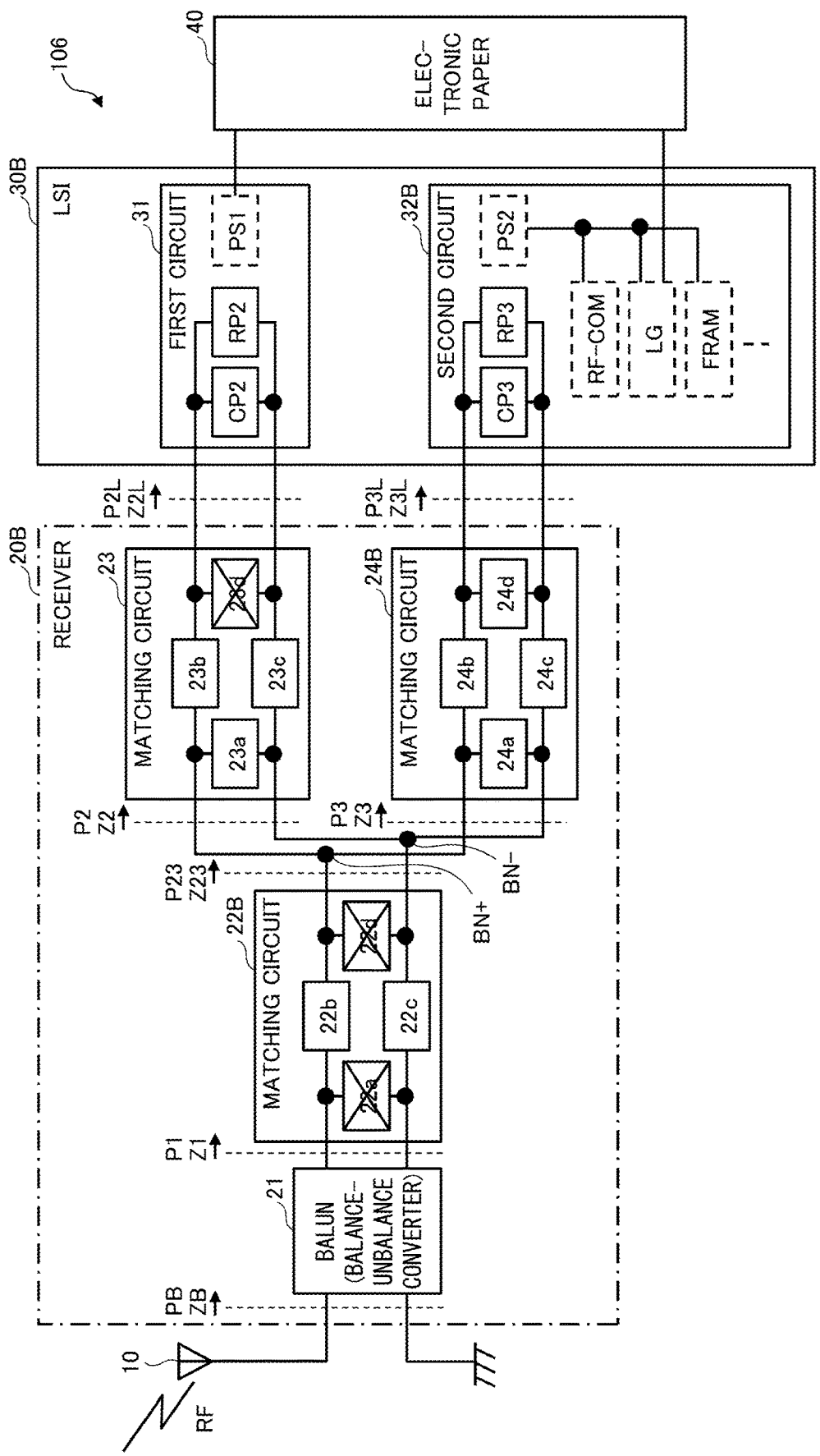
FIG. 10 is a block diagram illustrating another example of a system including another receiver.

The matching circuit 23 is disposed between the branch points BN+ and BN− and the first circuit 31 of the LSI 30 to perform impedance matching between the branch points BN+ and BN− and the first circuit 31. For example, the matching circuit 23 includes elements 23a, 23b, 23c, and 23d as π-type circuits. At least one of the elements 23a, 23b, 23c, and 23d includes a delay element. The matching circuit 23 outputs a portion of the antenna input power received through the matching circuit 22 to the first circuit 31 as the first input power. Here, an X symbol illustrated in element 23d indicates that element 23d is not implemented in the present embodiment. In FIGS. 7 and 10, which will be described later, elements with the X symbols are not implemented.

The matching circuit 24 is disposed between the branch points BN+ and BN− and the second circuit 32 of the LSI 30 to perform impedance matching between the branch points BN+ and BN− and the second circuit 32. For example, the matching circuit 24 includes elements 24a, 24b, 24c, and 24d as π-type circuits. At least one of the elements 24a, 24b, 24c, and 24d includes a delay element. The matching circuit 24 outputs another portion of the antenna input power received through the matching circuit 22 to the second circuit 32 as the second input power. The symbols P (PB, P1, P23, P2, P3, P2L, and P3L) illustrated in FIG. 3 indicate power. The symbols Z (ZB, Z1, Z23, Z2, Z3, Z2L, and Z3L) illustrated in FIG. 3 indicate the impedance seen toward a direction of the arrow, which will be described with reference to FIGS. 4-6. The power P2L and P3L and the impedance Z1, Z23, Z2, Z3, Z2L, and Z3L will be described with reference to FIG. 5 and FIG. 6.

Here, the elements in the matching circuits 22, 23, and 24 illustrated in FIG. 3 are examples and an element may be added or deleted. The matching circuits 22, 23, 24 may include a T-type circuit including a delay element or a distributed element circuit including a delay element, instead of the π-type circuit. The matching circuit 22 is an example of a third matching circuit. The matching circuit 23 is an example of a first matching circuit. The matching circuit 24 is an example of a second matching circuit.

The first circuit 31 includes a power supply voltage generation circuit PS1 that generates a first power supply voltage that causes the electronic paper 40 to operate, in accordance with the first input power (P2L) received from the matching circuit 23. The first circuit 31 is represented as an equivalent circuit including an input capacitor CP2 and an input resistor RP2. The second circuit 32 includes a power supply voltage generation circuit PS2, a communication circuit RF-COM, a logic circuit LG, and an FRAM (registered trademark). The second circuit 32 is represented as an equivalent circuit including an input capacitor CP3 and an input resistor RP3.

The FRAM is an example of an electrically rewritable non-volatile memory. The power supply voltage generation circuit PS2 generates a second power supply voltage that causes the communication circuit RF-COM, the logic circuit LG, and the FRAM to operate, in accordance with the second input power (P3L) received from the matching circuit 24. If types of the second power supply voltage used in the communication circuit RF-COM, the logic circuit LG, and the FRAM are different, the power supply voltage generation circuit PS2 may have a function of generating multiple types of the second power supply voltages.

The communication circuit RF-COM performs a reception process of the radio signal RF received through the antenna 10 and a transmission process of the radio signal RF transmitted from the antenna 10. The communication circuit RF-COM is information included in the radio signal RF received by the antenna 10 and is an example of an extractor that extracts display information to be displayed on the electronic paper 40.

The logic circuit LG writes the display information received from the communication circuit RF-COM to the FRAM. The logic circuit LG generates a control signal to operate the electronic paper 40, reads the display information to be displayed on the electronic paper 40 from the FRAM, and outputs the control signal and the display information to the electronic paper 40. Additionally, the logic circuit LG outputs the transmission information to be transmitted from the antenna 10 to the communication circuit RF-COM. The logic circuit LG is an example of a control circuit.

The electronic paper 40 operates in response to receiving the first power supply voltage from the power supply voltage generation circuit PS1 and performs an operation to rewrite the display of the electronic paper 40 in accordance with the control signal received from the logic circuit LG.

A minimum value of the second power supply voltage at which the communication circuit RF-COM, the logic circuit LG, and the FRAM can operate is lower than a minimum value of the first power supply voltage at which the electronic paper 40 can operate. Thus, even if the distance between the RFID tag and the reader/writer is large, the antenna input power is low, and then the first power supply voltage required for the rewrite operation of the electronic paper 40 cannot be generated, an electronic product code (EPC) of the RFID tag can be read from the reader/writer and an item to which the RFID tag is attached can be identified from a long distance, by causing the second circuit 32 to operate.

Here, the system 102 may include another electronic device instead of the electronic paper 40. In this case, the LSI 30 outputs, from the first circuit 31, the first power supply voltage that causes the electronic device to operate and outputs the control signal that controls the operation of the electronic device from the second circuit 32.

Figure 4:
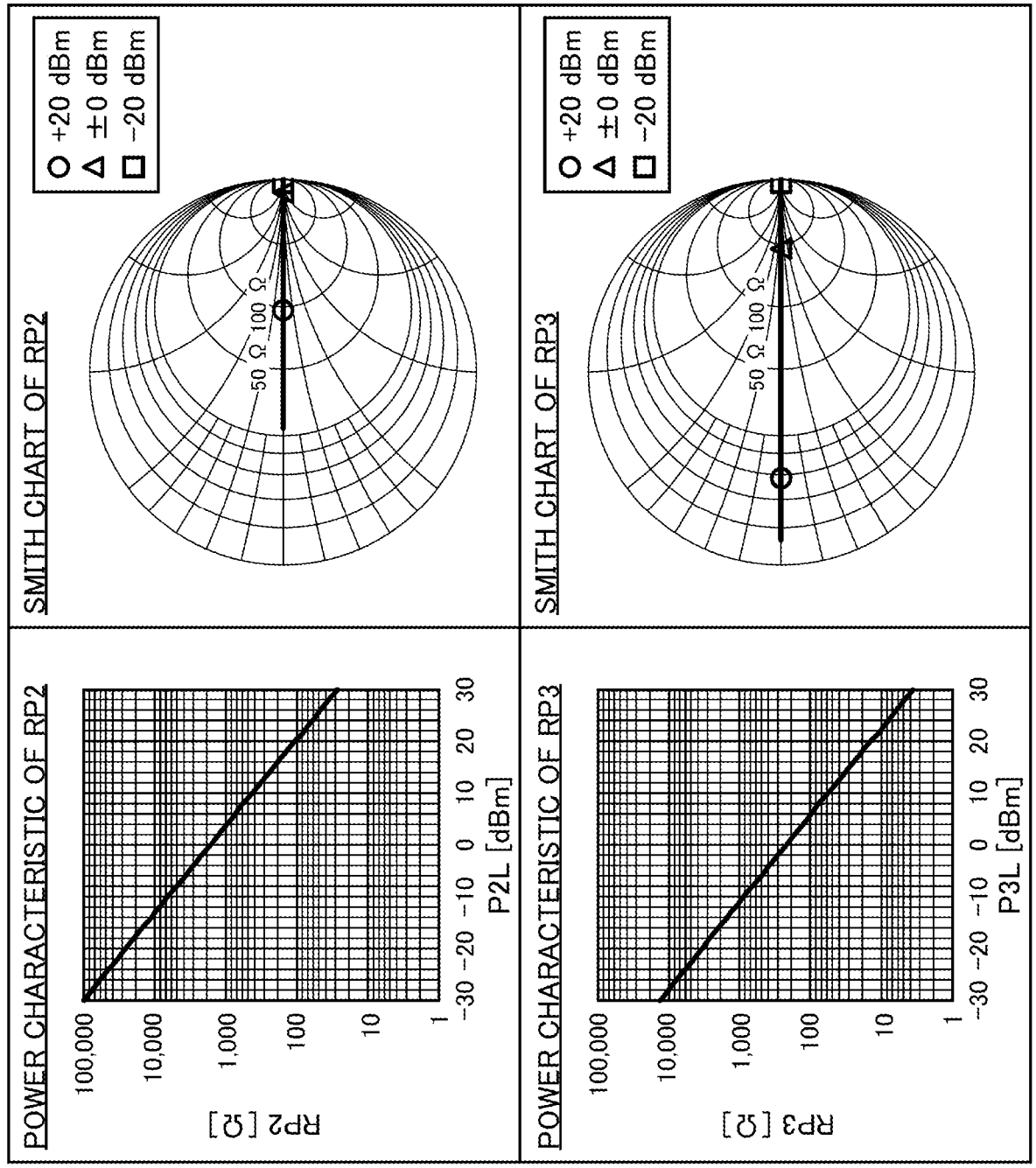
FIG. 4 is a drawing illustrating examples of the power characteristic and Smith charts of RP2 and RP3 in FIG. 3.
Figure 5:
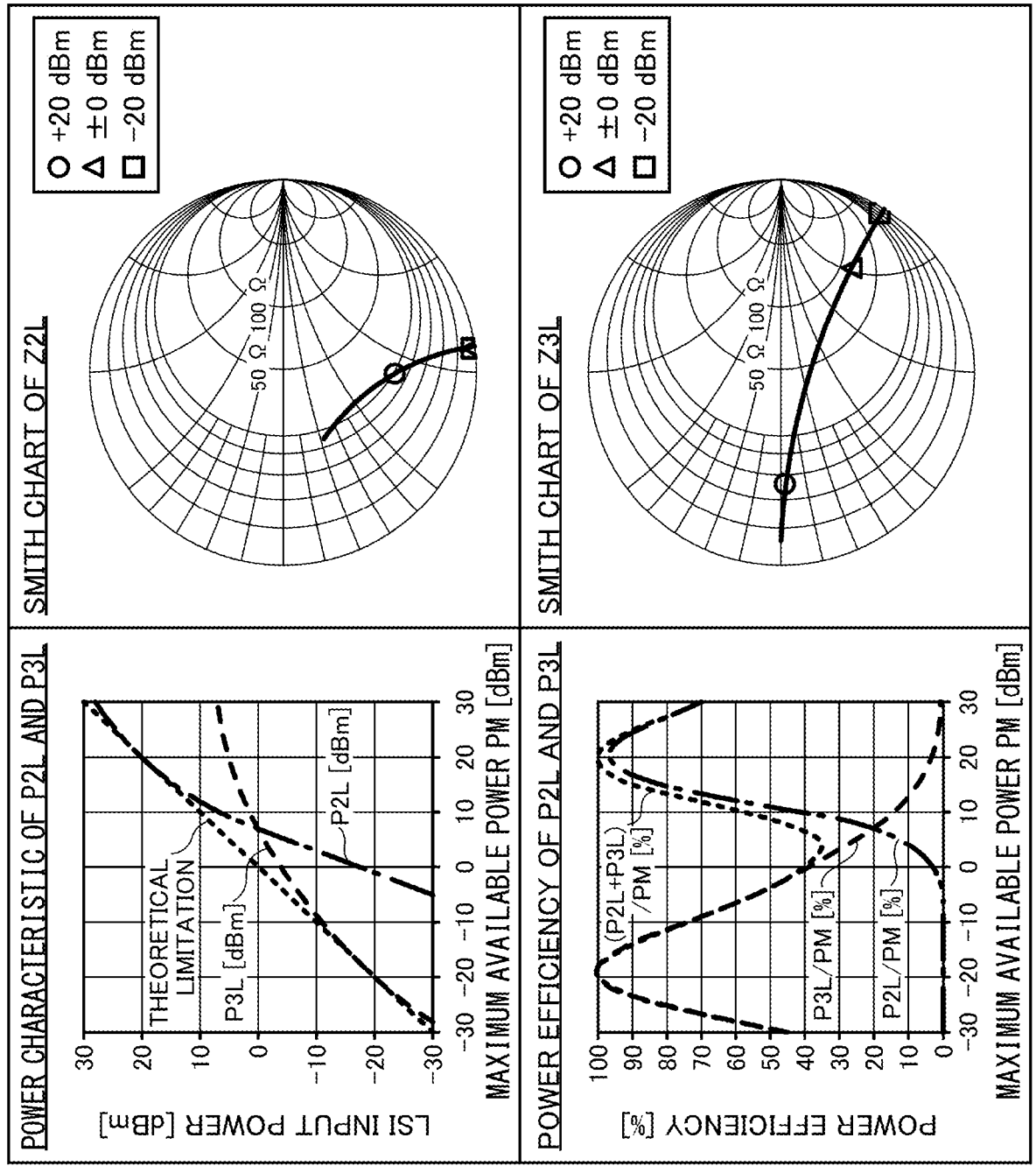
FIG. 5 is a drawing illustrating examples of the power characteristics and the power efficiencies of P2L and P3L in FIG. 3 and Smith charts of Z2L and Z3L.
Figure 6:
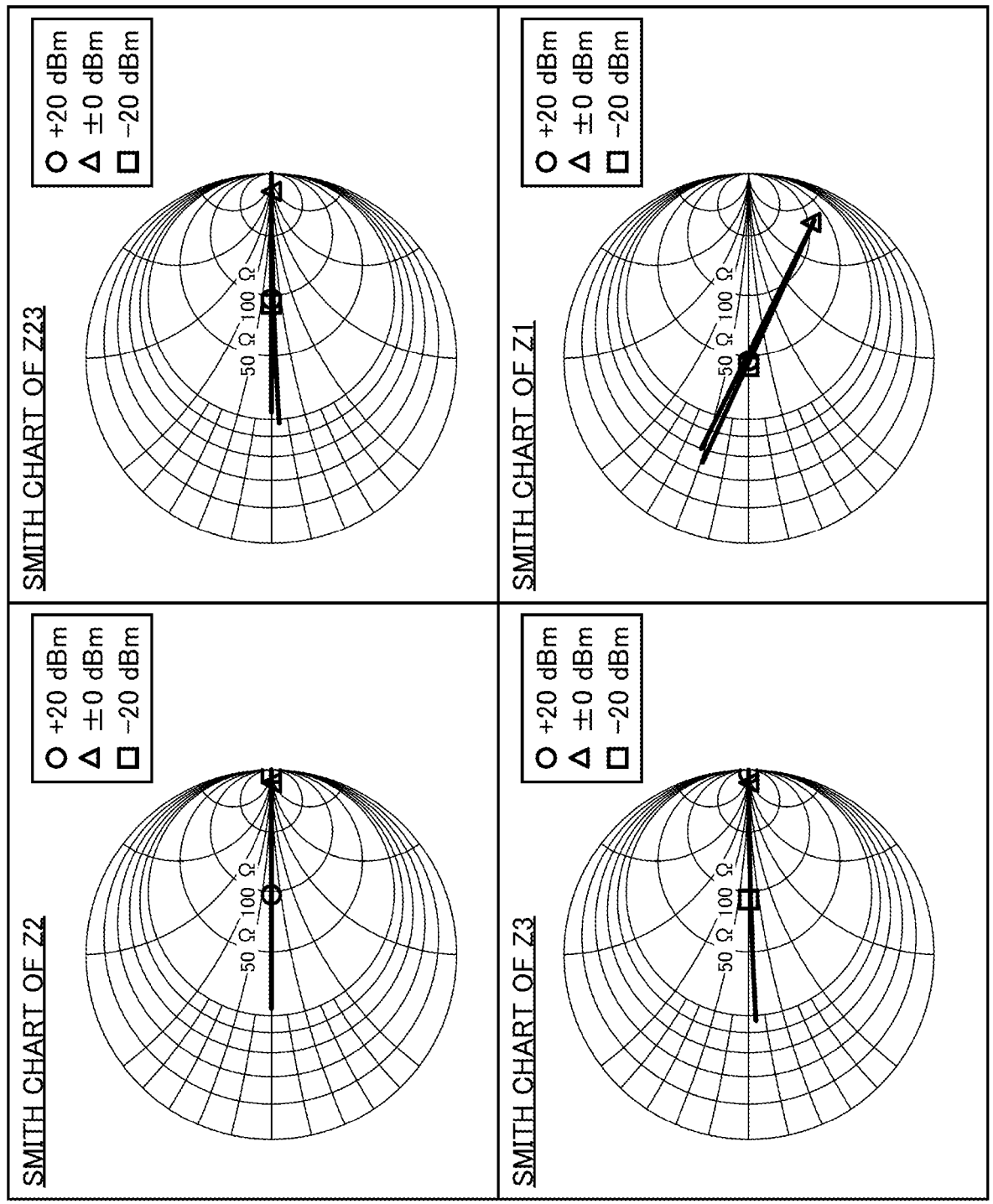
FIG. 6 is a drawing illustrating an example of Smith charts of Z2, Z3, Z23, and Z1 in FIG. 3.

FIGS. 4 to 6 illustrate examples of the electrical characteristics of the receiver 20 and the LSI 30 of FIG. 3. In the following, for example, the frequency of the radio signal RF is 920 MHz, the minimum power, at which the rewrite operation to rewrite the display of the electronic paper 40 can be performed, is +20 dBm, and the minimum power, at which the second circuit 32 (the communication circuit RF-COM, the logic circuit LG, and the FRAM) can operate, is −20 dBm.

For example, the input capacitor CP2 of the first circuit 31 of the LSI 30 is set to 3 pF and the input capacitor CP3 of the second circuit 32 of the LSI 30 is set to 1 pF. Because the input resistor RP2 of the first circuit 31 and the input resistor RP3 of the second circuit 32 are dependent on the power, the respective power characteristics are illustrated in FIG. 4.

The circuit constant of the matching circuit 22 is 7.5 nH for the element 22a, 1.4 nH for the elements 22b and 22c, and 3.3 pF for the element 22d. This achieves matching between 50Ω on the antenna 10 and the balun 21 side and 100Ω on the branch points BN+ and BN− side, and a delay of 13.4°.

The circuit constant of the matching circuit 23 is 10 nH for the element 23a, 0Ω for the elements 23b and 23c, and the element 23d is not implemented. This achieves matching between 100Ω on the branch points BN+ and BN− side and 100Ω//3 pF (CP2) on the first circuit 31 side, and a delay of 0°.

The circuit constant of the matching circuit 24 is 100 nH for the element 24a, 0.6 pF for the elements 24b and 24c, and 23 nH for the element 24d. This achieves matching between 100Ω on the branch points BN+ and BN− side and 3.5 kΩ//1 pF (CP3) on the second circuit 32 side, and a delay of −90°.

FIG. 4 illustrates examples of the power characteristics and Smith charts of the input resistors RP2 and RP3 of FIG. 3. The input resistors RP2 and RP3 differ from each other in the power dependence and the Smith charts differ from each other, due to their different applications.

FIG. 5 is a drawing illustrating examples of the power characteristics and the power efficiencies of the P2L and the P3L in FIG. 3 and Smith charts of the Z2L and the Z3L. That is, FIG. 5 illustrates an example of an operation method of the receiver 20. As illustrated in the Smith chart of Z2L, the impedance Z2L has a downward sloping characteristic due to the input capacitor CF2. As illustrated in the Smith Chart of Z3L, the impedance Z3L that is different in application from the impedance Z2L is also different in characteristic from the impedance Z2L.

In the power characteristic of the power P2L that is the operating power of the electronic paper 40, the rewrite operation of the electronic paper 40 can be performed at the power PM≥+20 dBm, which is the power P2L≥+20 dBm, and is operable approximately at a theoretical limit value. Here, the power PM is the maximum available power of the antenna 10 (the maximum power that can be supplied under optimal matching conditions).

In the power characteristic of the power P3L that is the operating power of the second circuit 32, the logic circuit LG and the like of the second circuit 32 is enabled at the power PM≥−20 dBm, which is the power P3L≥−20 dBm, and is operable approximately at a theoretical limit value.

This allows the power efficiency of the power P2L to be 0% at around the power P3L=−20 dBm at which the logic circuit LG and the like of the second circuit 32 starts to operate, as illustrated in the power efficiency of P2L and P3L. Thus, almost all of the antenna input power can be used to operate the logic circuit LG and the like of the second circuit 32.

Additionally, this allows the power efficiency of the power P3L to be 5% or less at around the power P2L=+20 dBm at which the electronic paper 40 starts to operate. Thus, most of the antenna input power can be used to operate the electronic paper 40 and the unnecessary power P3L is prevented from being supplied to the logic circuit LG and the like of the second circuit 32. As a result, the power efficiency can be optimized for each of multiple power states (+20 dBm of the rewrite operation of the electronic paper 40 and −20 dBm of the second circuit 32).

Here, the number of elements of the matching circuits can be reduced by partially integrating the matching circuits 22, 23, and 24 of FIG. 3, and the circuit size of the receiver 20 can be reduced. As a result, the reliability of the system 102 can be improved by reducing the number of components, and the cost of the system 102 can be reduced.

For example, the element 22d of the matching circuit 22, the element 23a of the matching circuit 23, and the element 24a of the matching circuit 24 may be unimplemented. This is because combined parallel admittance of the element 22d (3.3 pF, +19.08 mS), the element 23a (100 nH, −j1.73 mS) and the element 24a (10 nH, −j17.30 mS) is +j0.05 mS (approximately 0), and almost no characteristic is changed.

FIG. 6 illustrates examples of Smith charts of Z2, Z3, Z23, and Z1 of FIG. 3. As illustrated in the Smith chart of Z2, the impedance Z2 is adjusted to match 100Ω at +20 dBm and to have a higher impedance as the power decreases. Here, the reason for matching 100Ω rather than 50Ω is to simplify the circuit of the matching circuit 23.

As illustrated in the Smith chart of Z3, the impedance Z3 is adjusted by impedance matching to match 100Ω at −20 dBm and to have a higher impedance as the power increases due to a delay of −90°.

As illustrated in the Smith chart of Z23, the impedance Z23 is adjusted to match 100Ω at +20 dBm and −20 dBm. As illustrated in the Smith chart of Z1, the impedance Z1 is adjusted to match 50Ω that is the impedance on the antenna 10 side, at +20 dBm and −20 dBm.

As described above, in the present embodiment, substantially the same effect as in the above-described embodiment can be obtained. For example, the power P2L and P3L in accordance with the antenna input power can be caused to reach the ideal power distribution characteristic. By allowing the delay amounts (the phases) of the delay elements of the matching circuits 23 and 24 to differ from each other, the characteristics of the changes in the impedances Z2L and Z3L relative to the antenna input power can be reversely set from each other. That is, the impedance Z2L can be reduced as the antenna input power increases, and the impedance Z3L can increase as the antenna input power increases.

Thus, as described in FIG. 5, the power P2L supplied to the first circuit 31 and the power P3L supplied to the second circuit 32 can be appropriately set in accordance with the antenna input power. As a result, in the receiver 20 that converts the radio signal RF received through the antenna 10 into multiple types of power, the power P2L and P3L can be appropriately distributed in accordance with the magnitude of the antenna input power, thereby optimizing the power efficiency for each of the multiple types of power.

The maximum available power PM for obtaining the minimum power (+20 dBm) of the power P2L that causes the matching circuit 23 to operate can be reduced as compared to a conventional approach. Thus, for example, if the system 102 (the RFID tag) is attached to a store shelf or an item, a distance between the reader/writer that can identify the item by reading the EPC and the system 102 can be made longer (e.g., three to ten times longer) than in a conventional approach.

As a result, the number of the systems 102 that can transmit information to the reader/writer can be increased. Here, the system 102 may include another electronic device instead of the electronic paper 40.

FIG. 7 illustrates an example of a system including another receiver. The same elements as in FIG. 3 are referenced by the same reference numerals and the detailed description is omitted. A system 104 illustrated in FIG. 7 includes the antenna 10, a receiver 20A, the LSI 30, and the electronic paper 40. The receiver 20A has a configuration substantially the same as the configuration of the receiver 20 in FIG. 3 except that the matching circuit 24A is included instead of the matching circuit 24 of the receiver 20 in FIG. 3. In the matching circuit 24A, the elements 24a and 24d are not implemented and the elements 24b and 24c are set to 16 pF.

Figure 8:
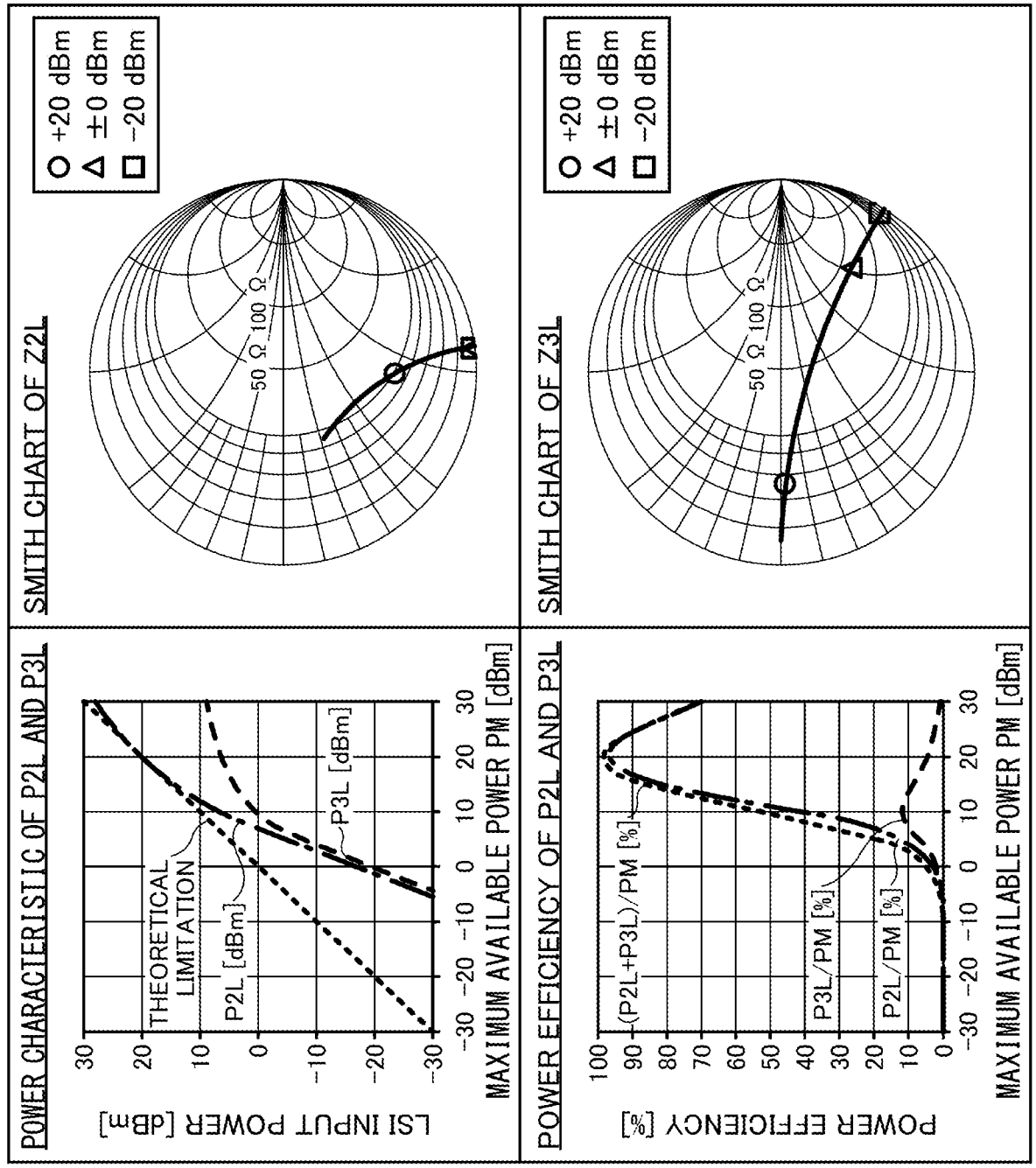
FIG. 8 is a drawing illustrating the power characteristic and the power efficiency of P2L and P3L in FIG. 7 and Smith charts of Z2L and Z3L.
Figure 9:
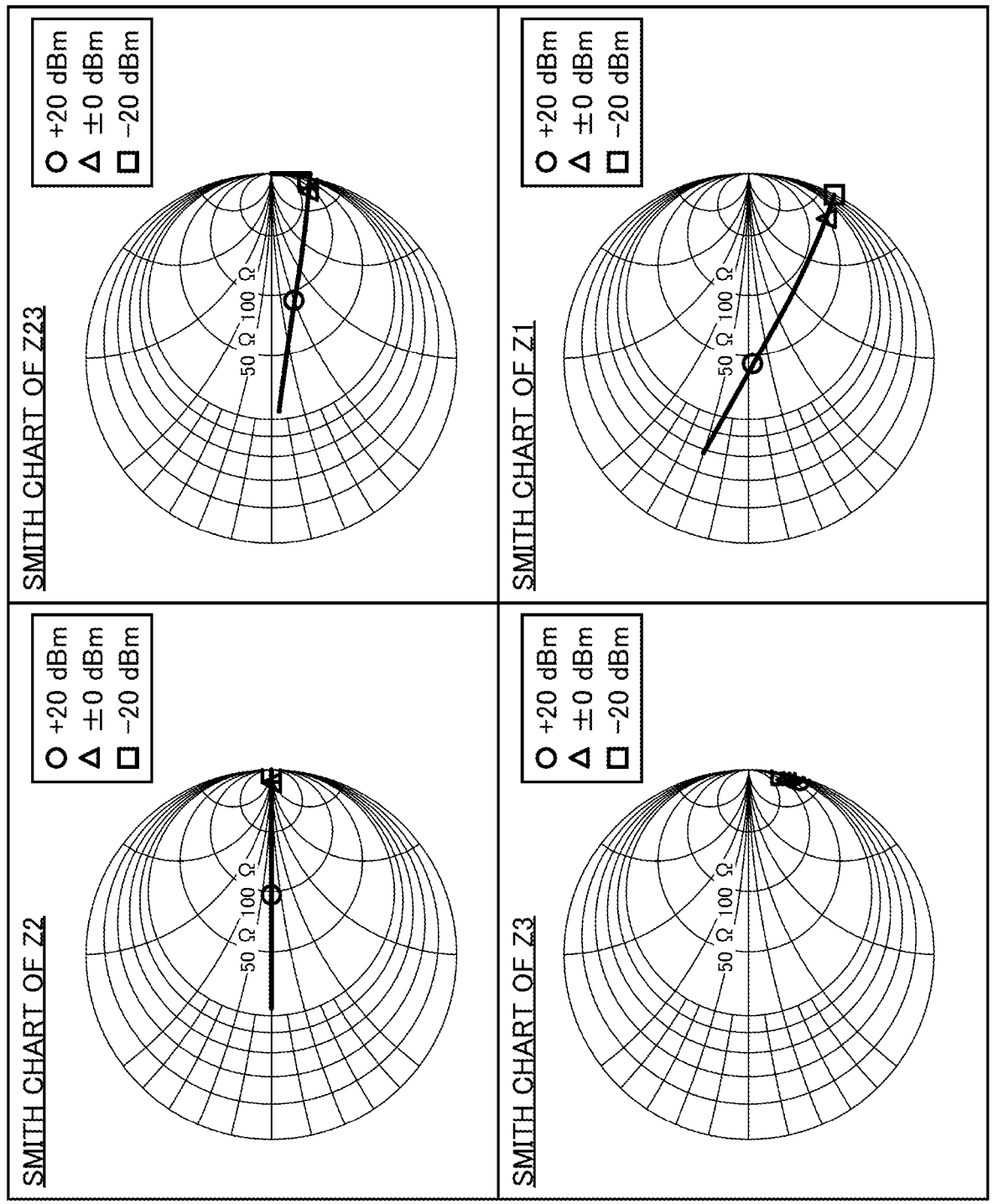
FIG. 9 is a drawing illustrating an example of Smith charts of Z2, Z3, Z23, and Z1 in FIG. 7.

FIG. 8 and FIG. 9 illustrate examples of the electrical characteristics of the receiver 20A in FIG. 7. As in the above-described embodiment, the frequency of the radio signal RF is 920 MHz, the minimum power at which the rewrite operation of the electronic paper 40 can be performed is +20 dBm, and the minimum power at which the second circuit 32 (the communication circuit RF-COM, the logic circuit LG, and the FRAM) can operate is −20 dBm.

As in FIG. 3, the input capacitor CP2 of the first circuit 31 in FIG. 7 is set to 3 pF, and the input capacitor CP3 of the second circuit 32 is set to 1 pF. The input resistors RP2 and RP3 have the power dependence, as with the input resistors RP2 and RP3 in FIG. 3. Therefore, the power characteristics and the Smith chart of the input resistors RP2 and RP3 are the same as in FIG. 4.

The circuit constant of the matching circuit 22 is substantially the same as in the above-described embodiment, and the circuit constant is 7.5 nH for the element 22a, is 1.4 nH for the elements 22b and 22c, and is 3.3 pF for the element 22d. This achieves matching between 50Ω on the antenna 10 and the balun 21 side and 97−j17Ω on the branch points BN+ and BN− side, and a delay of 13.4°.

The circuit constant of the matching circuit 23, as in the above-described embodiment, is 10 nH for the element 23a, 0Ω for the elements 23b and 23c, and the element 23d is not implemented. This achieves matching between 100Ω on the branch points BN+ and BN− side and 100Ω//3 pF (CP2) on the first circuit 31 side, and a delay of 0°. The circuit constant of the matching circuit 24 is 1 pF for the elements 24b and 24c, and the elements 24a and 24d are not implemented. This reduces the coupled amount on the second circuit 32 side.

FIG. 8 illustrates examples of the power characteristics and power efficiencies of P2L and P3L and Smith charts of Z2L and Z3L in FIG. 7. The Smith charts of Z2L and Z3L are the same as in FIG. 6. The power characteristic of the power P2L is substantially the same as in FIG. 5, and thus the rewrite operation of the electronic paper 40 can be performed at the power PM≥+20 dBm, which is the power P2L≥+20 dBm, and is operable at the theoretical limit value.

With respect to the above, the operation of the logic circuit LG and the like of the second circuit 32 is enabled at PM≥0 dBm, which is P3L≥−20 dBm. Thus, the maximum available power PM degrades by nearly 20 dB relative to the theoretical limit. Therefore, in the system 104 of FIG. 7, in order to operate the logic circuit LG and the like of the second circuit 32, antenna input power larger than the antenna input power of the system 102 of FIG. 3 is required. As a result, a distance between the reader/writer that can identify the item by reading the EPC and the system 104 becomes shorter (e.g., one-third to one-tenth) than that of the embodiment described above.

FIG. 9 illustrates examples of Smith charts of Z2, Z3, Z23, and Z1 in FIG. 7. The Smith chart of Z2 is the same as in FIG. 6. As illustrated in the Smith chart of Z3, the impedance Z3 is adjusted to a high impedance, regardless of the power, in order to reduce the coupling amount.

As illustrated in the Smith chart of Z23, the impedance Z23 is adjusted to be approximately 100Ω at +20 dBm. As illustrated in the Smith chart of Z1, the impedance Z1 is adjusted to match 50Ω that is the impedance on the antenna 10 side at +20 dBm.

FIG. 10 illustrates another example of a system including another receiver. The same elements as in FIG. 3 are referenced by the same reference numerals and the detailed description is omitted. A system 106 illustrated in FIG. 10 includes the antenna 10, a receiver 20B, an LSI 30B, and the electronic paper 40. The receiver 20B has a configuration substantially the same as the configuration of the receiver 20 in FIG. 3, except that matching circuits 22B and 24B are included instead of the matching circuits 22 and 24 in FIG. 3.

The LSI 30B has a configuration substantially the same as the configuration of the LSI 30 in FIG. 3 except that a second circuit 32B is included instead of the second circuit 32 in FIG. 3. The second circuit 32B has a configuration substantially the same as the configuration of the second circuit 32 in FIG. 3 except that the input capacitor CP3 differs from the input capacitor CP3 in FIG. 3.

Figure 11:
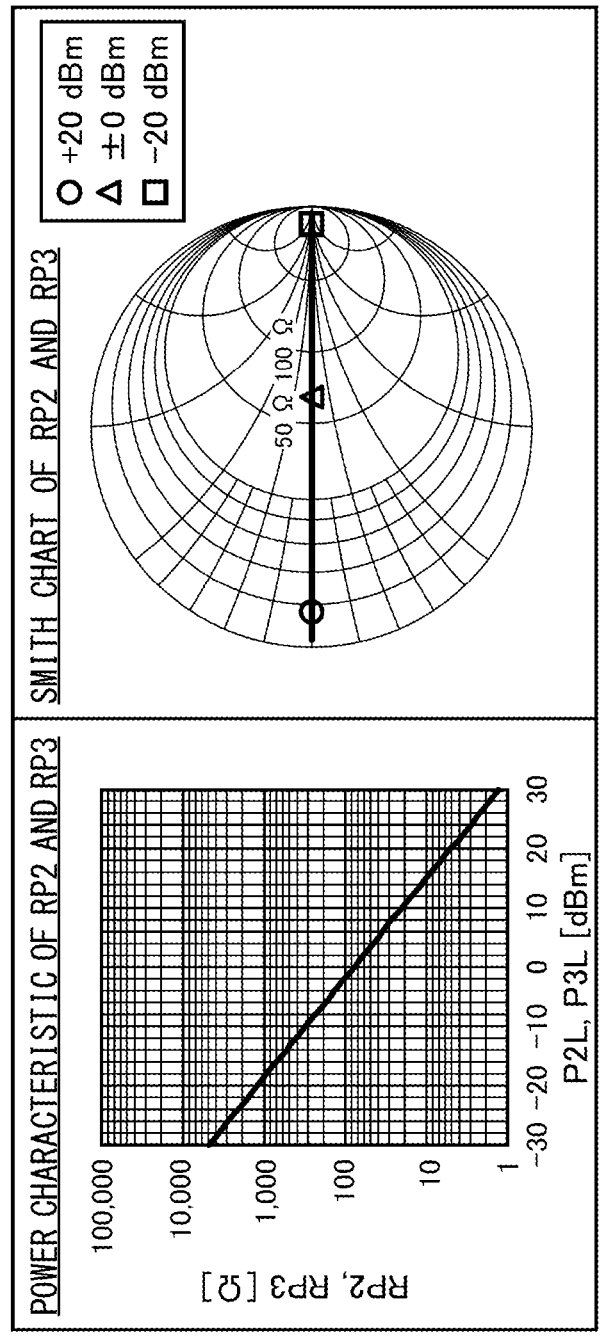
FIG. 11 is a drawing illustrating an example of the power characteristic and a Smith chart of RP2 and RP3 in FIG. 10.
Figure 12:
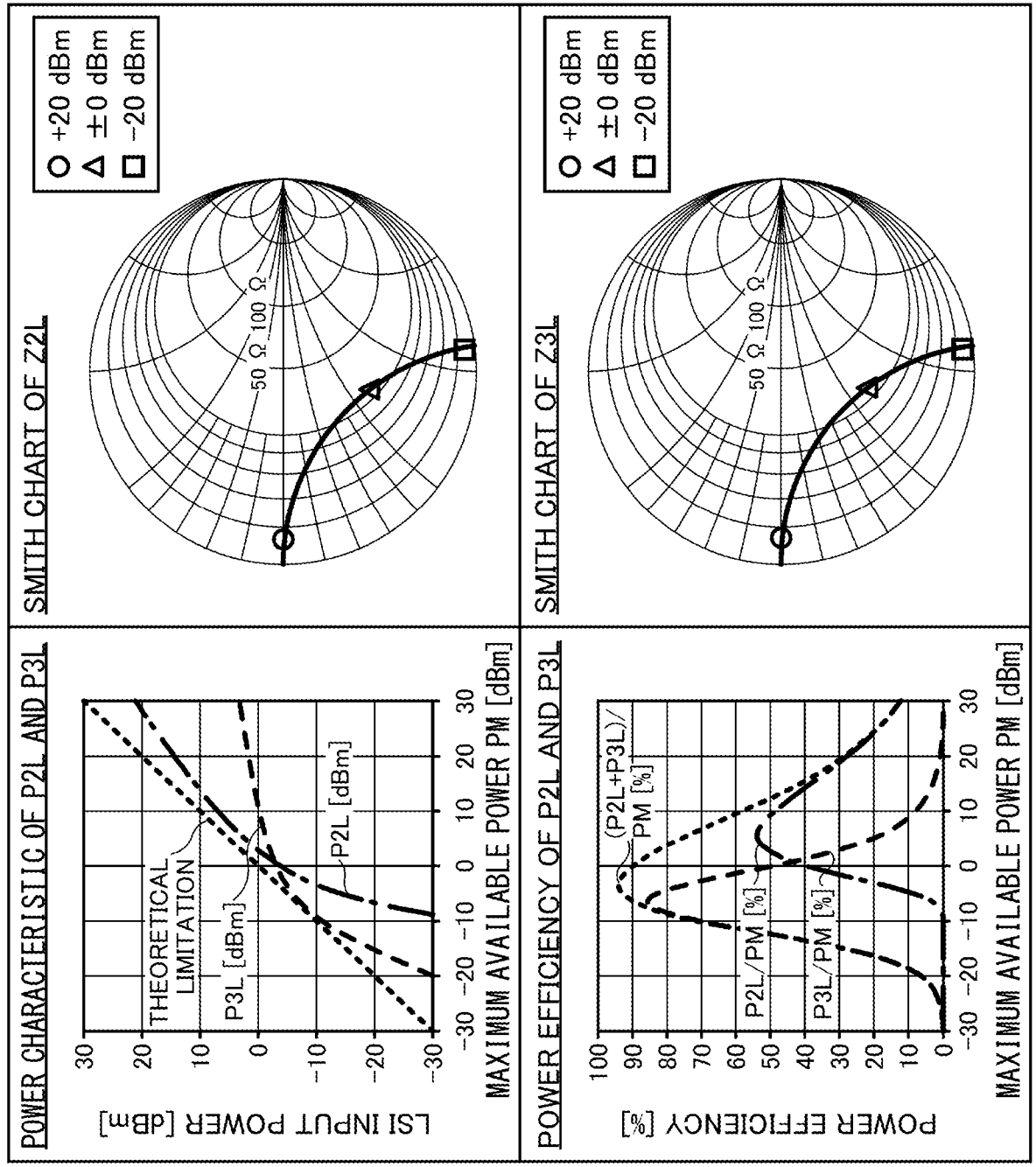
FIG. 12 is a drawing illustrating the power characteristic and the power efficiency of P2L and P3L in FIG. 10 and Smith charts of Z2L and Z3L.
Figure 13:
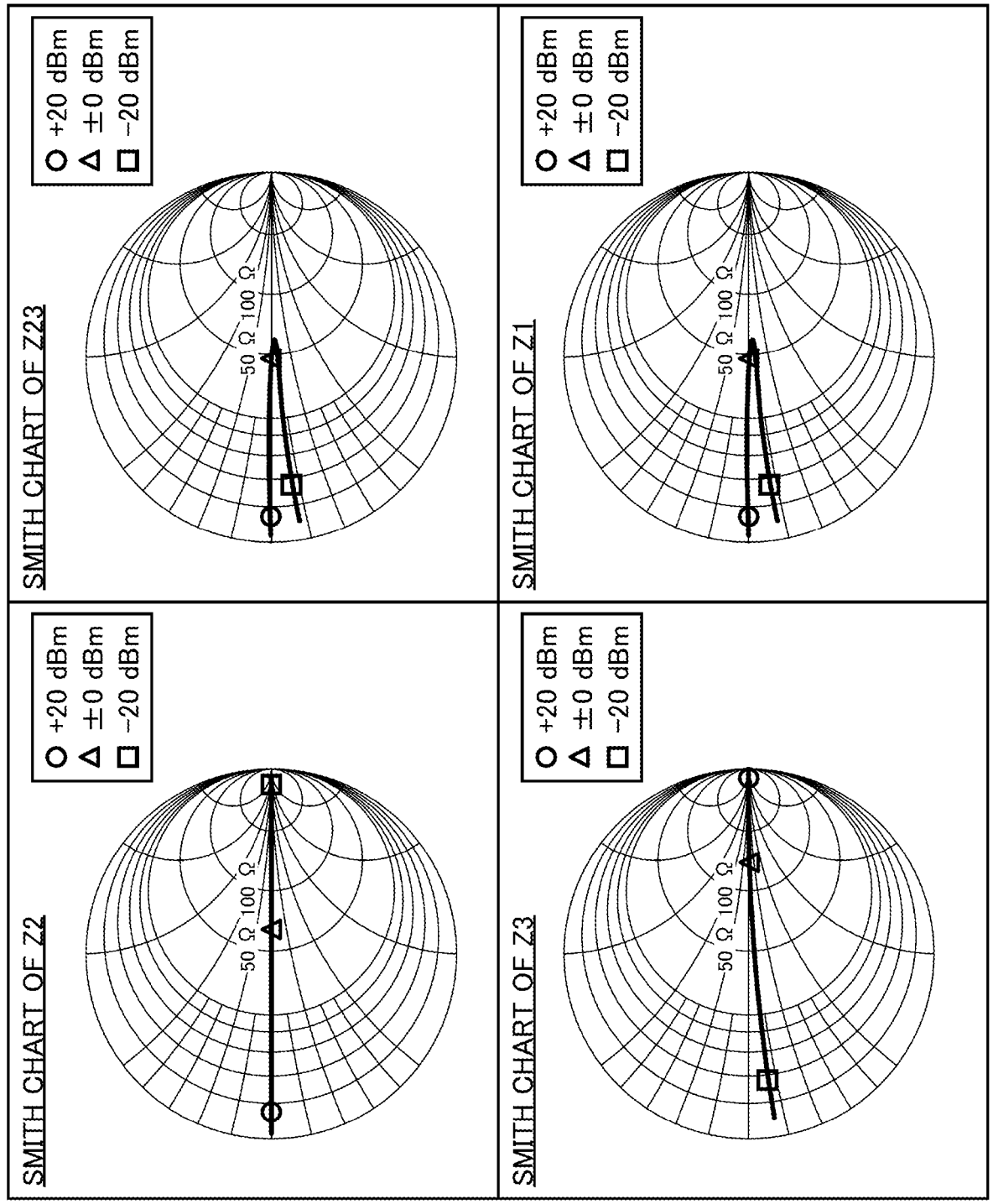
FIG. 13 is a drawing illustrating an example of Smith charts of Z2, Z3, Z23, and Z1 in FIG. 10.

FIGS. 11 to 13 illustrate an example of the electrical characteristic of the receiver 20B of FIG. 10. In the following, for example, the frequency of the radio signal RF is 520 MHz, the minimum power at which the rewrite operation to rewrite the display of the electronic paper 40 can be performed is +20 dBm, and the minimum power at which the second circuit 32 (the communication circuit RF-COM, the logic circuit LG, and the FRAM) can be performed is −20 dBm.

For example, the input capacitor CP2 of the first circuit 31 of the LSI 30B is set to 3 pF, and the input capacitor CP3 of the second circuit 32B of the LSI 30B is set to 3 pF. The power supply voltage generation circuit PS1 and the power supply voltage generation circuit PS2 have the same characteristic. The input resistor RP2 of the first circuit 31 and the input resistor RP3 of the second circuit 32 are power dependent and are identical to each other. The power characteristics of the input resistors RP2 and RP3 are illustrated in FIG. 11.

The circuit constant of the matching circuit 22B is 0Ω for the elements 24b and 24c, and the elements 22a and 22d are not implemented. This achieves matching between 50Ω on the antenna 10 and the balun 21 side and 50Ω on the branch points BN+ and BN− side, and a delay of 0°.

The circuit constant of the matching circuit 23 is substantially the same as that of the matching circuit 23 in FIG. 3, and is 10 nH for the element 23a, is 0Ω for the elements 23b and 23c, and the element 23d is not implemented. This achieves matching between 100Ω on the branch points BN+ and BN− side and 100Ω//3 pF (CP2) on the first circuit 31 side, and a delay of 0°.

The matching circuit 23 and the matching circuit 24B have the same characteristic except a delay, only convert 100Ω to 100Ω, and have substantially no matching function except canceling the admittance of the input capacitor CP2 and the input capacitor CP3.

FIG. 11 illustrates an example of the power characteristic and a Smith chart of the input resistors RP2 and RP3 in FIG. 10. The power characteristics of the input resistors RP2 and RP3 are identical to each other, and the Smith charts of the input resistors RP2 and RP3 are identical to each other.

FIG. 12 illustrates examples of the power characteristics and power efficiencies of P2L and P3L in FIG. 10 and Smith charts of Z2L and Z3L. In the power characteristic of the power P2L that is the operating power of the electronic paper 40, the rewrite operation of the electronic paper 40 can be performed at the power PM≥+30 dBm, which is the power P2L≥+20 dBm. In the power characteristic of the power P3L that is the operating power of the second circuit 32B, the logic circuit LG and the like of the second circuit 32B can be performed at the power PM≥−15 dBm, which is the power P3L≥−20 dBm. As illustrated by the power efficiencies of P2L and P3L, the optimum power efficiency is limited to a specific power condition (in this example, around 0 dBm). Here, as illustrated in the Smith charts of Z2L and Z3L, the impedance Z2L and the impedance Z3L have the same characteristic.

FIG. 13 illustrates examples of Smith charts of Z2, Z3, Z23, and Z1 in FIG. 10. As illustrated in the Smith chart of Z2, the impedance Z2 is adjusted to match 100Ω when the power P2L is −3 dBm (0 dBm when P2L and P3L are combined), and as the power is reduced, the impedance becomes higher.

As illustrated in the Smith chart of Z3, the impedance Z3 is adjusted to match 100Ω when the power P3L is −3 dBm (0 dBm when P2L and P3L are combined), and as the power increases, the impedance becomes higher. The Smith charts of Z23 and Z1 are identical to each other and the impedance Z23 and the impedance Z1 are adjusted to match 50Ω (2 of 100Ω in parallel) at +0 dBm.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A receiver comprising:
a first matching circuit configured to receive antenna input power through a branch point in accordance with a radio signal received by an antenna and input a portion of the received antenna input power to a first circuit as first input power, the antenna input power being input from the antenna; and
a second matching circuit configured to receive the antenna input power through the branch point and input another portion of the received antenna input power to a second circuit as second input power,
wherein at least either the first matching circuit or the second matching circuit includes a delay element that delays a phase of a first input signal or a phase of a second input signal so that an impedance of the first matching circuit decreases as the antenna input power increases and an impedance of the second matching circuit increases as the antenna input power increases, the first input power supplied to the first circuit and the second input power supplied to the second circuit being controlled by the impedance of the first matching circuit and the impedance of the second matching circuit,
wherein with the impedance of the first matching circuit being high relative to the impedance of the second matching circuit, more of the antenna input power is supplied to the second circuit than to the first circuit, and
wherein with the impedance of the second matching circuit being high relative to the impedance of the first matching circuit, more of the antenna input power is supplied to the first circuit than to the second circuit.

2. The receiver as claimed in claim 1,
wherein the first input power is smaller than the second input power when the antenna input power is smaller than a predetermined value, and
wherein the first input power is larger than the second input power when the antenna input power is larger than the predetermined value.

3. The receiver as claimed in claim 1, wherein the phase of the first input signal and the phase of the second input signal are different from each other.

4. The receiver as claimed in claim 3, wherein the delay element delays the phase of the second input signal relative to the phase of the first input signal.

5. The receiver as claimed in claim 4, wherein the delay of the phase that is caused by the delay element is smaller than one period of the radio signal received by the antenna.

6. The receiver as claimed in claim 1, further comprising a third matching circuit configured to match an impedance between the antenna and the branch point, the third matching circuit being disposed between the antenna and the branch point.

7. The receiver as claimed in claim 1, wherein with the antenna input power being larger than a first predetermined value and with the first input power exceeding a first threshold power to operate the first circuit, the first circuit operates and the impedance of the second matching circuit prevents an excess of the second input power from being supplied to the second circuit, with the antenna input power being larger than a second predetermined value and less than the first predetermined value and with the second input power exceeding a second threshold power to operate the second circuit, the second circuit operates and the impedance of the first matching circuit prevents the first input power from causing the first circuit to operate, and the first threshold power to operate the first circuit is greater than the second threshold power to operate the second circuit.

8. A system comprising:
a receiver including a first matching circuit and a second matching circuit, the first matching circuit and the second matching circuit receiving antenna input power through a branch point in accordance with a radio signal received by an antenna, the antenna input power being input from the antenna;
a first circuit; and a second circuit,
wherein the first matching circuit inputs a portion of the received antenna input power to the first circuit as first input power,
wherein the second matching circuit inputs another portion of the received antenna input power to the second circuit as second input power,
wherein at least either the first matching circuit or the second matching circuit includes a delay element that delays a phase of a first input signal or a phase of a second input signal so that an impedance of the first matching circuit decreases as the antenna input power increases and an impedance of the second matching circuit increases as the antenna input power increases, the first input power supplied to the first circuit and the second input power supplied to the second circuit being controlled by the impedance of the first matching circuit and the impedance of the second matching circuit,
wherein the first input power causes the first circuit to operate,
wherein the second input power causes the second circuit to operate,
wherein with the impedance of the first matching circuit being high relative to the impedance of the second matching circuit, more of the antenna input power is supplied to the second circuit than to the first circuit, and
wherein with the impedance of the second matching circuit being high relative to the impedance of the first matching circuit, more of the antenna input power is supplied to the first circuit than to the second circuit.

9. The system as claimed in claim 8, further comprising an electronic device connected to the first circuit and the second circuit,
wherein the first circuit includes a first power supply voltage generation circuit configured to generate a first power supply voltage that causes the electronic device to operate, based on the first input power, and
wherein the second circuit includes a second power supply voltage generation circuit configured to generate a second power supply voltage based on the second input power, and a control circuit configured to generate a control signal that causes the electronic device to operate, the control circuit being caused to operate by the second power supply voltage.

10. The system as claimed in claim 9,
wherein the electronic device is an electronic paper,
wherein the second circuit further includes
a non-volatile memory that stores display information to be displayed on the electronic paper, the non-volatile memory being electrically rewritable, and
an extractor that extracts the display information included in the radio signal received by the antenna, and
wherein the control circuit has a function to write the display information extracted by the extractor in the non-volatile memory and a function to read the display information from the non-volatile memory and output the display information to the electronic paper.

11. The system as claimed in claim 8, further comprising a board on which the first matching circuit, the second matching circuit, the first circuit, and the second circuit are mounted, the antenna being incorporated into the board.

12. The system as claimed in claim 8, wherein
with the antenna input power being larger than a first predetermined value and with the first input power exceeding a first threshold power to operate the first circuit, the first circuit operates and the impedance of the second matching circuit prevents an excess of the second input power from being supplied to the second circuit,
with the antenna input power being larger than a second predetermined value and less than the first predetermined value and with the second input power exceeding a second threshold power to operate the second circuit, the second circuit operates and the impedance of the first matching circuit prevents the first input power from causing the first circuit to operate, and
the first threshold power to operate the first circuit is greater than the second threshold power to operate the second circuit.

13. An operation method of a receiver including a first matching circuit and a second matching circuit that receive antenna input power through a branch point in accordance with a radio signal received by an antenna, the antenna input power being input from the antenna, the first matching circuit inputting a portion of the received antenna input power to a first circuit as first input power, the second matching circuit inputting another portion of the received antenna input power to a second circuit as second input power, and at least either the first matching circuit or the second matching circuit including a delay element, the operation method comprising:
delaying, by the delay element, a phase of a first input signal or a phase of a second input signal so that an impedance of the first matching circuit decreases as the antenna input power increases and an impedance of the second matching circuit increases as the antenna input power increases, the first input power supplied to the first circuit and the second input power supplied to the second circuit being controlled by the impedance of the first matching circuit and the impedance of the second matching circuit,
wherein with the impedance of the first matching circuit being high relative to the impedance of the second matching circuit, more of the antenna input power is supplied to the second circuit than to the first circuit, and
wherein with the impedance of the second matching circuit being high relative to the impedance of the first matching circuit, more of the antenna input power is supplied to the first circuit than to the second circuit.

14. The operation method as claimed in claim 13, wherein
with the antenna input power being larger than a first predetermined value and with the first input power exceeding a first threshold power to operate the first circuit, the first circuit operates and the impedance of the second matching circuit prevents an excess of the second input power from being supplied to the second circuit,
with the antenna input power being larger than a second predetermined value and less than the first predetermined value and with the second input power exceeding a second threshold power to operate the second circuit, the second circuit operates and the impedance of the first matching circuit prevents the first input power from causing the first circuit to operate, and
the first threshold power to operate the first circuit is greater than the second threshold power to operate the second circuit.

* * * * *